(12) United States Patent
Chambers et al.

(10) Patent No.: US 9,397,009 B2
(45) Date of Patent: *Jul. 19, 2016

(54) STRUCTURE AND METHOD FOR METAL GATE STACK OXYGEN CONCENTRATION CONTROL USING AN OXYGEN DIFFUSION BARRIER LAYER AND A SACRIFICIAL OXYGEN GETTERING LAYER

(71) Applicant: Texas Instruments Incorporated, Dallas, TX (US)

(72) Inventors: James Joseph Chambers, Dallas, TX (US); Hiroaki Niimi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/739,681

(22) Filed: Jun. 15, 2015

(65) Prior Publication Data

US 2015/0311126 A1 Oct. 29, 2015

Related U.S. Application Data

(60) Continuation of application No. 14/146,095, filed on Jan. 2, 2014, now Pat. No. 9,087,918, which is a division of application No. 12/275,812, filed on Nov. 21, 2008, now Pat. No. 8,643,113.

(51) Int. Cl.

| H01L 21/3205 | (2006.01) |
|---|---|
| H01L 21/8238 | (2006.01) |
| H01L 21/28 | (2006.01) |
| H01L 29/51 | (2006.01) |
| H01L 29/66 | (2006.01) |
| H01L 29/78 | (2006.01) |

(Continued)

(52) U.S. Cl.
CPC .. *H01L 21/823842* (2013.01); *H01L 21/28088* (2013.01); *H01L 21/28185* (2013.01); *H01L 21/3221* (2013.01); *H01L 21/823807* (2013.01); *H01L 21/823857* (2013.01); *H01L 29/401* (2013.01); *H01L 29/42364* (2013.01); *H01L 29/51* (2013.01); *H01L 29/517* (2013.01); *H01L 29/518* (2013.01); *H01L 29/66545* (2013.01); *H01L 29/7833* (2013.01); *H01L 21/823814* (2013.01); *H01L 27/092* (2013.01); *H01L 27/11* (2013.01)

(58) Field of Classification Search
CPC ............................................... H01L 21/823842
USPC ........................................................ 438/592
See application file for complete search history.

(56) References Cited

U.S. PATENT DOCUMENTS

| 7,646,067 B2 | 1/2010 | Nam et al. | |
|---|---|---|---|
| 9,087,918 B2 * | 7/2015 | Chambers | ......... H01L 21/28088 |

(Continued)

*Primary Examiner* — Anthony Ho
(74) *Attorney, Agent, or Firm* — Jacqueline J. Garner; Frank D. Cimino

(57) ABSTRACT

A process is disclosed of forming metal replacement gates for NMOS and PMOS transistors with oxygen in the PMOS metal gates and metal atom enrichment in the NMOS gates such that the PMOS gates have effective work functions above 4.85 eV and the NMOS gates have effective work functions below 4.25 eV. Metal work function layers in both the NMOS and PMOS gates are oxidized to increase their effective work functions to the desired PMOS range. An oxygen diffusion blocking layer is formed over the PMOS gate and an oxygen getter is formed over the NMOS gates. A getter anneal extracts the oxygen from the NMOS work function layers and adds metal atom enrichment to the NMOS work function layers, reducing their effective work functions to the desired NMOS range. Processes and materials for the metal work function layers, the oxidation process and oxygen gettering are disclosed.

19 Claims, 7 Drawing Sheets

(51) Int. Cl.
*H01L 21/322* (2006.01)
*H01L 29/40* (2006.01)
*H01L 29/423* (2006.01)
*H01L 27/092* (2006.01)
*H01L 27/11* (2006.01)

(56) References Cited

U.S. PATENT DOCUMENTS

2008/0017930 A1   1/2008   Kim et al.
2008/0290416 A1   11/2008  Yu et al.

* cited by examiner ments. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

STRUCTURE AND METHOD FOR METAL GATE STACK OXYGEN CONCENTRATION CONTROL USING AN OXYGEN DIFFUSION BARRIER LAYER AND A SACRIFICIAL OXYGEN GETTERING LAYER

CROSS REFERENCE TO RELATED APPLICATIONS

This application is a continuation of U.S. Nonprovisional patent application Ser. No. 14/146,095, filed Jan. 2, 2014, which is a divisional of U.S. Nonprovisional patent application Ser. No. 12/275,812, filed Nov. 21, 2008, now U.S. Pat. No. 8,643,113, the contents of which are herein incorporated by reference in its entirety.

FIELD OF THE INVENTION

This invention relates to the field of integrated circuits. More particularly, this invention relates to replacement metal gates of MOS transistors in integrated circuits.

BACKGROUND OF THE INVENTION

N-channel metal oxide semiconductor (NMOS) and p-channel metal oxide semiconductor (PMOS) transistors in advanced integrated circuits frequently have replacement metal gates to improve on-state current densities. Attaining desired effective work functions of the metal gates in both NMOS and PMOS transistors without significantly increasing fabrication cost and complexity has been problematic.

SUMMARY OF THE INVENTION

The instant invention provides a process for forming an integrated circuit which includes NMOS and PMOS transistors with metal replacement gates. The process forms gate work function metal layers in the PMOS transistors with effective work functions above 4.85 eV and gate work function metal layers in the NMOS transistors with effective work functions below 4.25 eV.

Work function metal layers with effective work functions approximately at mid-gap are formed in both the NMOS and PMOS gates. The work function metal layers are oxidized to increase their effective work functions to the desired PMOS range. Various oxidation processes suitable for this step are disclosed.

An oxygen diffusion blocking layer is formed over the PMOS gate and an oxygen getter is formed over both gates. Materials for the oxygen diffusion blocking layer and the getter are disclosed. A getter anneal extracts the oxygen from the NMOS work function layers into the getter material and adds metal atoms from the getter into the NMOS work function layers, reducing their effective work functions to the desired NMOS range.

The getter is removed and a metal replacement gate material is formed in both NMOS and PMOS gates.

DETAILED DESCRIPTION

Figure 1A:
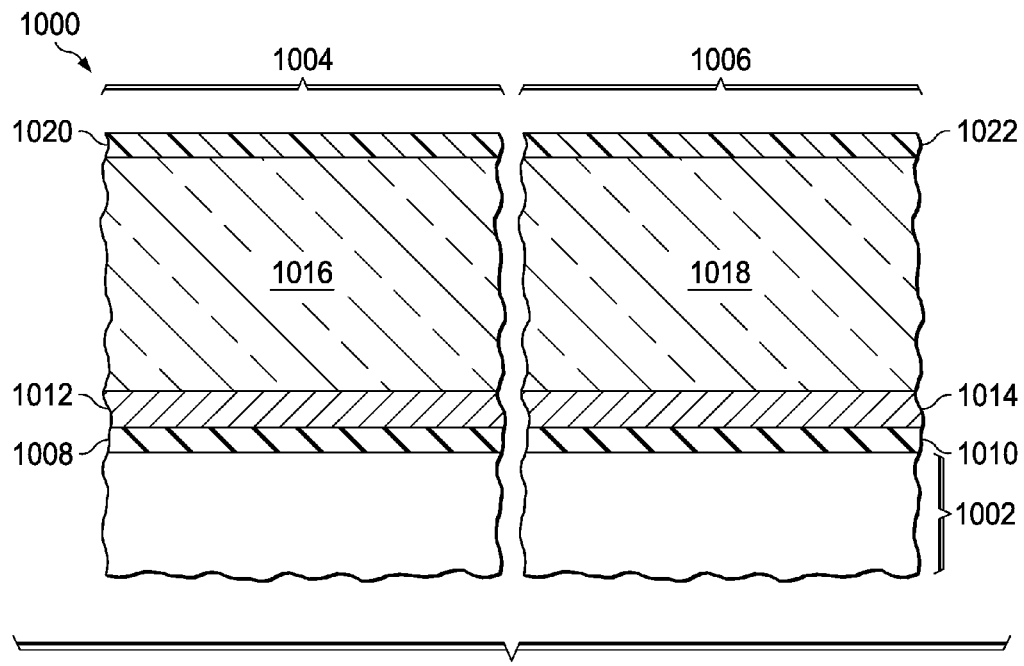
FIG. 1A through FIG. 1M are cross-sections of an integrated circuit containing an NMOS transistor and a PMOS transistor formed according to the instant invention, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "eV" is understood to mean the unit of energy known as electron-volt. One eV is substantially equal to $1.602 \times 10^{-19}$ joules. The term "meV" is understood to mean milli-electron volts. One meV is substantially equal to $1.602 \times 10^{-22}$ joules.

For the purposes of this disclosure, the term "MOS transistor" will be understood to mean metal oxide semiconductor transistor.

For the purposes of this disclosure, the term "work function" will be understood to mean a potential energy difference, measured in eV, between an electron at the Fermi level in a material, to which the work function is being referenced, and an electron in a vacuum adjacent to the material. For example, intrinsic silicon has a work function of approximately 4.6 eV at room temperature. N-type silicon with a doping density between $3 \times 10^{17}$ cm$^{-3}$ and $3 \times 10^{18}$ cm$^{-3}$ has a work function of approximately 4.1 eV at room temperature. P-type silicon with a doping density between $3 \times 10^{17}$ cm$^{-3}$ and $3 \times 10^{18}$ cm$^{-3}$ has a work function of approximately 5.1 eV at room temperature. The term "effective work function" will be understood to mean a calculated potential energy of an electron in a gate in an MOS transistor which is consistent with an observed flat-band potential and all substrate and gate interface charge effects.

For the purposes of this disclosure, the term "getter" will be understood to refer to a material which has a capability of absorbing an element such as oxygen from a region surrounding the getter material. Similarly, the term "gettering" will be understood to mean the act of absorbing an element into a getter material.

Chemical formulas such as SiON of a material in this disclosure are understood to list elements of which the material is substantially composed, but no stoichiometric relationships between the elements are implied or may be assumed, unless numerical subscripts are included in the chemical formulas.

The instant invention provides a process for forming an integrated circuit which includes NMOS and PMOS transistors with metal replacement gates. The process forms gate work function metal layers in the PMOS transistors with effective work functions above 4.85 eV and gate work function metal layers in the NMOS transistors with effective work functions below 4.25 eV.

FIG. 1A through FIG. 1M are cross-sections of an integrated circuit containing an NMOS transistor and a PMOS transistor formed according to the instant invention, depicted in successive stages of fabrication. Referring to FIG. 1A, the integrated circuit (1000) is formed on a semiconductor substrate (1002) which is commonly a single crystal silicon wafer, but may be a silicon-on-insulator (SOI) wafer, a hybrid orientation technology (HOT) wafer with regions of different crystal orientations, or other material appropriate for fabrication of the IC (1000). The integrated circuit (1000) contains an NMOS region (1004) for an NMOS transistor and a PMOS region (1006) for a PMOS transistor. An NMOS gate dielectric layer (1008) is formed on a top surface of the substrate (1002) in the NMOS region (1004). The NMOS gate dielectric layer (1008) is typically one or more layers of silicon oxide ($SiO_x$), silicon nitride ($Si_3N_4$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The NMOS gate dielectric layer (1008) may include nitrogen as a result of exposure to a nitrogen containing plasma or a nitrogen containing ambient gas at temperatures between 50° C. and 800° C. The NMOS gate dielectric layer (1008) is typically between 1 and 4 nanometers thick. A thicker NMOS gate dielectric layer (1008) may be formed in NMOS transistors operating above 2.5 volts. The NMOS gate dielectric layer (1008) may be formed by any of a variety of gate dielectric formation processes, for example thermal oxidation, plasma nitridation of an oxide layer, and/or dielectric material deposition by atomic layer deposition (ALD).

A PMOS gate dielectric layer (1010) is formed on a top surface of the substrate (1002) in the PMOS region (1006). The PMOS gate dielectric layer (1010) is typically between 1 and 4 nanometers thick, and includes some or all of the same materials in the NMOS gate dielectric layer (1008). A thicker PMOS gate dielectric layer (1010) may be formed in PMOS transistors operating above 2.5 volts. All or part of the PMOS gate dielectric layer (1010) is typically formed concurrently with the NMOS gate dielectric layer (1008).

An NMOS gate work function metal layer (1012) is formed on a top surface of the NMOS gate dielectric layer (1008). The NMOS gate work function metal layer (1012) may be titanium nitride (TiN), tantalum nitride (TaN), tantalum carbide (TaC), or other metal with an effective work function between 4.5 and 4.7 eV. The NMOS gate work function metal layer (1012) may be between 1 and 10 nanometers thick, and may be formed by physical vapor deposition (PVD), chemical vapor deposition (CVD), metal-organic chemical vapor deposition (MOCVD), ALD, or other process appropriate for deposition of thin metal films. A PMOS gate work function metal layer (1014) is formed on a top surface of the PMOS gate dielectric layer (1010) of similar materials and properties as the NMOS gate work function metal layer (1012). In one embodiment, the PMOS gate work function metal layer (1014) may be formed concurrently with the NMOS gate work function metal layer (1012).

An NMOS dummy gate layer (1016) is formed on a top surface of the NMOS gate work function metal layer (1012). The NMOS dummy gate layer (1016) may be polycrystalline silicon, commonly known as polysilicon, or other material such as silicon germanium which has a high etch selectivity to the NMOS gate work function metal layer (1012) during a subsequent wet etch process. In one embodiment, the NMOS dummy gate layer (1016) is between 40 and 80 nanometers thick. In another embodiment, the thickness of the NMOS dummy gate layer (1016) is between two and three times a width of an NMOS gate to be formed in the NMOS region (1004). The NMOS dummy gate layer (1016) may be formed by plasma enhanced chemical vapor deposition (PECVD) or other deposition process appropriate for forming thin films of dummy gate material. In an alternate embodiment, the NMOS dummy gate layer (1016) may be doped with phosphorus to improve etch selectivity to the NMOS gate work function metal layer (1012) during the subsequent wet etch process.

A PMOS dummy gate layer (1018) is formed on a top surface of the PMOS gate work function metal layer (1014) of similar materials and properties as the NMOS dummy gate layer (1016). In one embodiment, the PMOS dummy gate layer (1018) may be formed concurrently with the NMOS dummy gate layer (1016).

An NMOS hard mask (1020) is formed on a top surface of the NMOS dummy gate layer (1016). The NMOS hard mask (1020) may include one or more layers of silicon nitride (SiN), silicon oxy-nitride (SiON), silicon carbide (SiC), silicon oxy-carbide (SiOC), silicon oxy-nitride-carbide (SiCON), or other dielectric material appropriate for blocking silicidation of the top surface of the NMOS dummy gate layer (1016) during a subsequent silicidation process, and appropriate for providing a stop layer for a subsequent chemical mechanical polish (CMP) process. The NMOS hard mask (1020) may be formed by PVD, CVD, PECVD, MOCVD or other deposition process. In one embodiment, the NMOS hard mask (1020) may be between 20 and 40 nanometers thick.

A PMOS hard mask (1022) is formed on a top surface of the PMOS dummy gate layer (1018) of similar materials and properties as the NMOS hard mask (1020). In one embodiment, the PMOS hard mask (1022) may be formed concurrently with the NMOS hard mask (1020).

Figure 1B:
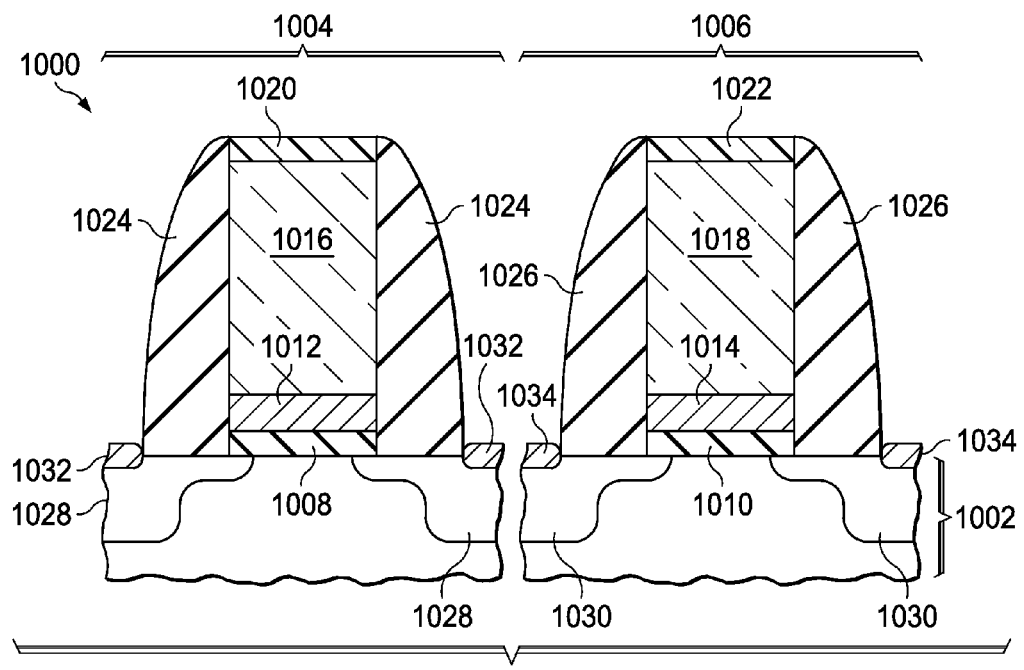

Referring to FIG. 1B, unwanted material from the NMOS hard mask (1020), the NMOS dummy gate layer (1016), the NMOS gate work function metal layer (1012) and the NMOS gate dielectric layer (1008) is removed during a gate etch process. Similarly, unwanted material from the PMOS hard mask (1022), the PMOS dummy gate layer (1018), the PMOS gate work function metal layer (1014) and the PMOS gate dielectric layer (1010) is removed during the gate etch process. A gate photoresist pattern, not shown in FIG. 1B for clarity, is formed on top surfaces of the NMOS hard mask (1020) and the PMOS hard mask (1022). The gate etch process includes reactive ion etch (RIE) process steps which provide fluorine containing etchants and possibly chlorine containing etchants from a plasma to a top surface of the integrated circuit (1000). The photoresist pattern blocks the etchants from areas of the NMOS region (1004) and PMOS region (1006) defined for an NMOS gate and a PMOS gate.

NMOS gate sidewall spacers (1024) are formed on lateral surfaces of the NMOS dummy gate layer (1016), the NMOS gate work function metal layer (1012) and the NMOS gate dielectric layer (1008), typically by deposition of one or more conformal layers of silicon nitride and/or silicon oxide on a top and lateral surfaces of the NMOS gate layers and the top surface of the substrate (1002), followed by removal of the conformal layer material from the top surface of the NMOS hard mask (1020) and the top surface of the substrate (1002) by anisotropic etching methods, leaving the conformal layer material on the lateral surfaces of the NMOS dummy gate layer (1016), the NMOS gate work function metal layer (1012) and the NMOS gate dielectric layer (1008). The NMOS gate sidewall spacers (1024) are typically 10 to 50 nanometers thick. Similarly, PMOS gate sidewall spacers (1026) are formed on lateral surfaces of the PMOS dummy gate layer (1018), the PMOS gate work function metal layer (1014) and the PMOS gate dielectric layer (1010). It is typical for a part of the PMOS gate sidewall spacers (1026) to be formed concurrently with the NMOS gate sidewall spacers (1024).

N-type source and drain (NSD) regions (1028), including n-type lightly doped drain (NLDD) regions, are formed in the substrate (1002) adjacent to the NMOS gate dielectric layer (1008) by ion implanting n-type dopants such as phosphorus and arsenic into the substrate (1002). NLDD regions are formed by implanting n-type NLDD dopants adjacent to the NMOS gate dielectric layer (1008) prior to formation of the NMOS gate sidewall spacers (1024). Additional n-type NSD dopants are implanted after formation of the NMOS gate sidewall spacers (1024) and annealed to form the NSD regions (1028). Similarly, p-type source and drain (PSD) regions (1030), including p-type lightly doped drain (PLDD) regions, are formed in the substrate (1002) adjacent to the PMOS gate dielectric layer (1010) by ion implanting p-type dopants such as boron and possibly gallium into the substrate (1002). PLDD regions are formed by implanting p-type PLDD dopants adjacent to the PMOS gate dielectric layer (1010) prior to formation of the PMOS gate sidewall spacers (1026). Additional p-type PSD dopants are implanted after formation of the PMOS gate sidewall spacers (1026) and annealed to form the PSD regions (1030).

NSD metal silicide layers (1032) are formed on top surfaces of the NSD regions (1028) and PSD metal silicide layers (1034) are formed on top surfaces of the PSD regions (1030). The metal silicide layers (1032, 1034) are formed on exposed silicon areas of the top surface of integrated circuit (1000), commonly by depositing a layer of metal, such as nickel, cobalt, or titanium, on a top surface of the IC (1000), heating the IC (1000) to react a portion of the metal with exposed silicon in active areas of the IC (1000), and selectively removing unreacted metal from the IC (1000) surface, commonly by exposing the IC (1000) to wet etchants including a mixture of an acid and hydrogen peroxide. The NMOS hard mask (1020) desirably blocks formation of metal silicide on the top surface of the NMOS dummy gate layer (1016), and the PMOS hard mask (1022) desirably blocks formation of metal silicide on the top surface of the PMOS dummy gate layer (1018). It is desirable to block formation of metal silicide on the top surfaces of the NMOS dummy gate layer (1016) and the PMOS dummy gate layer (1018) so as to improve etch characteristics of the dummy gate layers (1016, 1020) during a subsequent dummy gate removal process.

Figure 1C:
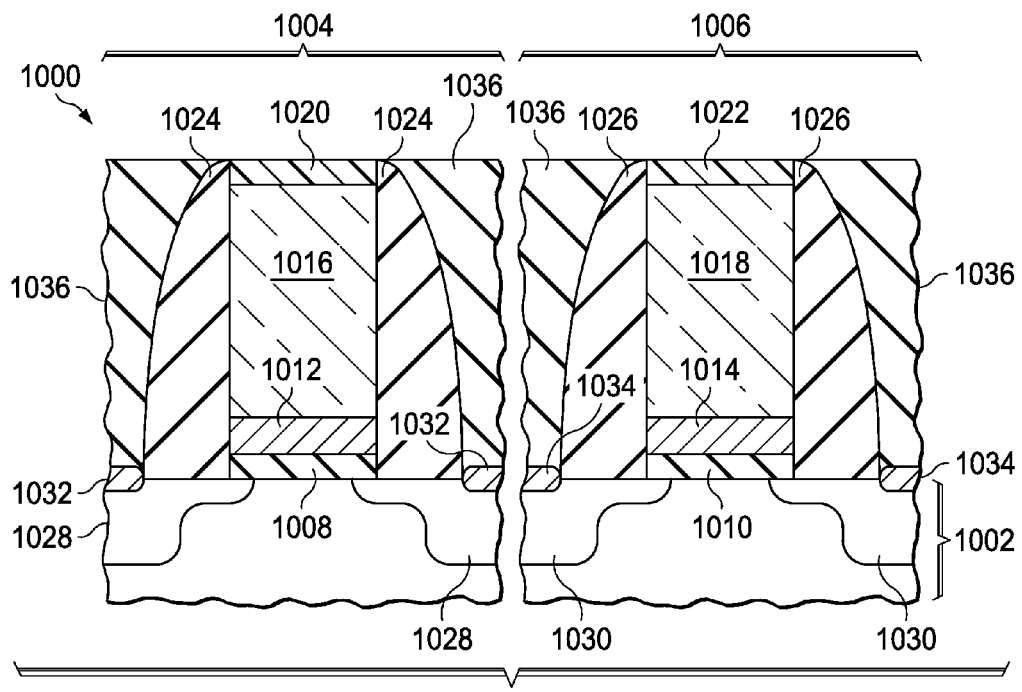

Referring to FIG. 1C, a conformal fill oxide layer (1036) is formed on an existing top surface of the integrated circuit (1000). In one embodiment, the fill oxide layer (1036) is composed substantially of silicon dioxide, formed by thermal decomposition of tetraethyl orthosilicate, also known as tetraethoxysilane or TEOS, by thermal curing of methylsilsesquioxane (MSQ), by a high density plasma (HDP) process, by an ozone based thermal chemical vapor deposition (CVD) process, also known as a high aspect ratio process (HARP), by a low pressure chemical vapor deposition (LPCVD) process or by an atmospheric pressure chemical vapor deposition (APCVD) process. The fill oxide layer (1036) is removed from top surfaces of the NMOS hard mask (1020) and the PMOS hard mask (1022) by a selective removal process such as an oxide CMP process. The NMOS hard mask (1020) and the PMOS hard mask (1022) desirably provide stop layers for the CMP process.

Figure 1D:
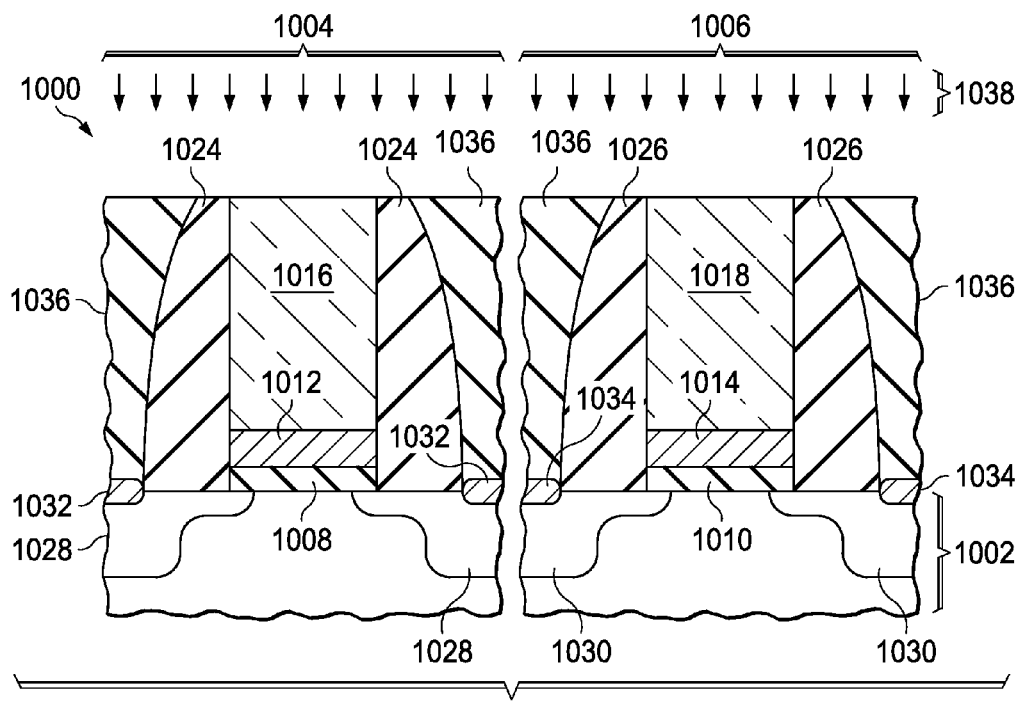

FIG. 1D depicts the integrated circuit (1000) after an etchback process (1038) which removes the NMOS hard mask (1020) and the PMOS hard mask (1022), and removes material from top surfaces of the NMOS gate sidewall spacers (1024), the PMOS gate sidewall spacers (1026) and the fill oxide layer (1036). In one embodiment, the etchback process (1038) provides substantially equal etch rates of the NMOS hard mask (1020), the PMOS hard mask (1022), the NMOS gate sidewall spacers (1024), the PMOS gate sidewall spacers (1026) and the fill oxide layer (1036). The etchback process (1038) may include an RIE step using fluorine containing etchants and possibly oxygen radicals and/or ions.

Figure 1E:
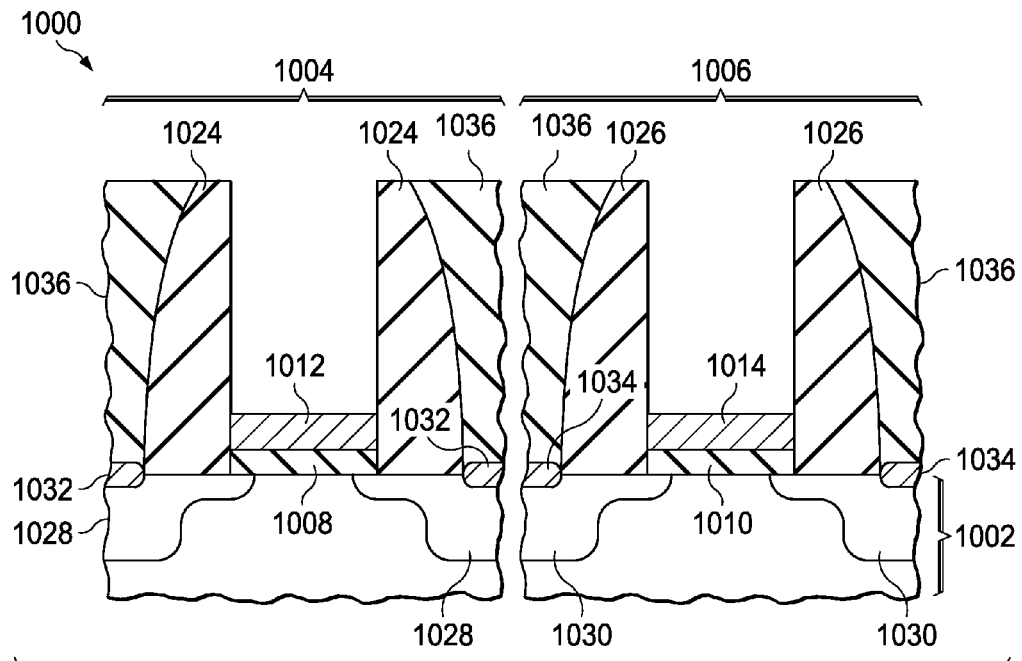

FIG. 1E depicts the integrated circuit (1000) after a dummy gate removal process. In one embodiment of the dummy gate removal process, the integrated circuit (1000) is exposed to wet etchants which include aqueous ammonium hydroxide ($NH_4OH$) at a concentration between 0.5 and 5 percent, at a temperature between 25° C. and 50° C., for 20 to 150 seconds. In another embodiment of the dummy gate removal process, the integrated circuit (1000) is exposed to wet etchants which include an aqueous mixture of $NH_4OH$ and tetra-methyl ammonium hydroxide (TMAH). In a further embodiment, the integrated circuit (1000) is exposed to wet etchants which include choline. The NMOS dummy gate layer material and the PMOS dummy gate layer material is removed from the NMOS region (1004) and the PMOS region (1006) while providing an etch selectivity to the NMOS gate work function metal layer (1012) and the PMOS gate work function metal layer (1014) of more than 100:1.

Figure 1F:
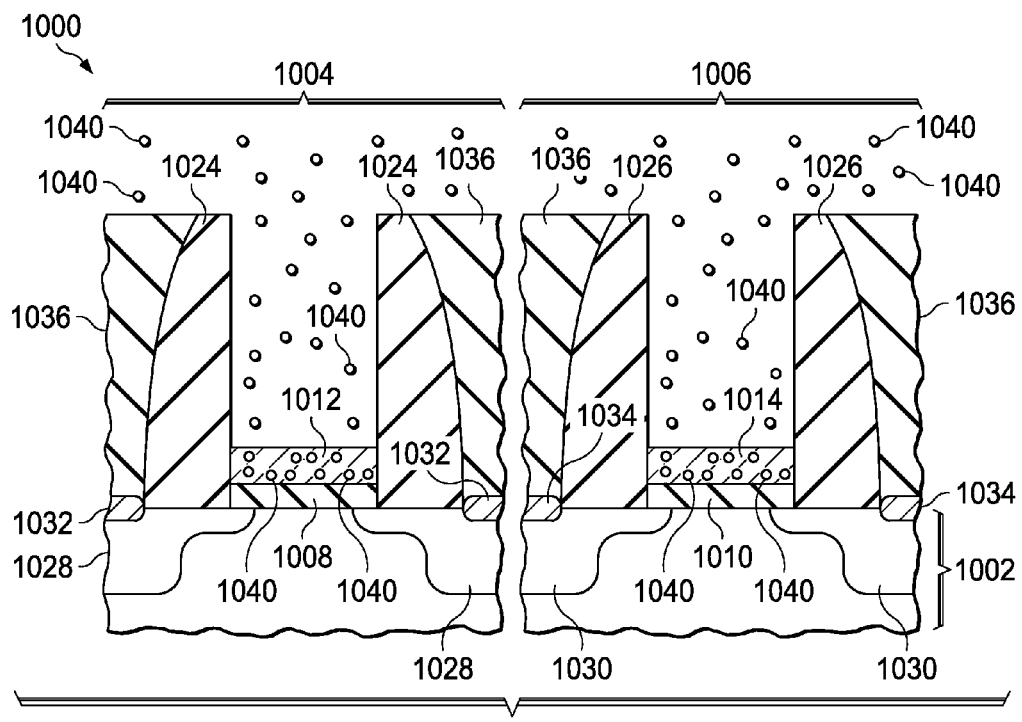

FIG. 1F depicts the integrated circuit (1000) during a low temperature oxidation process. Oxygen atoms (1040) are provided by the low temperature oxidation process to an existing top surface of the integrated circuit (1000), and diffuse in to the NMOS gate work function metal layer (1012) and the PMOS gate work function metal layer (1014). In one embodiment, the oxygen atoms (1040) in the gate work function metal layers (1012, 1014) may have a distribution of at least $1 \times 10^{15}$ atoms/cm$^2$ within 1 nanometer of the top surfaces of the NMOS gate dielectric layer (1008) and the PMOS gate dielectric layer (1010). In another embodiment, the oxygen atoms (1040) in the gate work function metal layers (1012, 1014) may have an average concentration between $1 \times 10^{18}$ atoms/cm$^3$ and $1 \times 10^{21}$ atoms/cm$^3$. The oxygen atoms (1040) in the gate work function metal layers (1012, 1014) increase the effective work functions of the gate work function metal layers (1012, 1014) to above 4.85 eV.

In a first embodiment of the low temperature oxidation process, the integrated circuit (1000) may be exposed to a steam ambient between 300° C. and 600° C. for 10 seconds to 30 minutes, as described in as described in U.S. Patent Provisional Application 61/116,892, filed Nov. 21, 2008 hereby incorporated by reference. In an alternate embodiment, the integrated circuit may be exposed to a steam ambient between 900° C. and 1100° C. for less than 1 second, as described in the aforementioned US Patent Provisional Application.

In a second embodiment of the low temperature oxidation process, the integrated circuit (1000) may be exposed to a plasma containing oxygen and hydrogen at a temperature up to 500° C., as described in the aforementioned US Patent Provisional Application. In an alternate embodiment, the integrated circuit may be exposed to a plasma containing oxygen, and subsequently exposed to a plasma containing hydrogen, as described in the aforementioned US Patent Provisional Application.

In a third embodiment of the low temperature oxidation process, the gate work function metal layers (1012, 1014) may be anodized at a temperature up to 100° C., as described in the aforementioned US Patent Provisional Application.

In a fourth embodiment of the low temperature oxidation process, the integrated circuit (1000) may be exposed to a dry ambient containing an oxidizing component, such as oxygen ($O_2$), ozone ($O_3$), nitric oxide (NO), nitrous oxide ($NO_2$), or any combination of these gases. The ambient may also include inert gases such as nitrogen or argon. The integrated circuit (1000) may be heated to 300° C. to 700° C. during exposure to the dry ambient.

In a fifth embodiment of the low temperature oxidation process, the integrated circuit (1000) may be exposed to H₂O containing dissolved ozone.

Figure 1G:
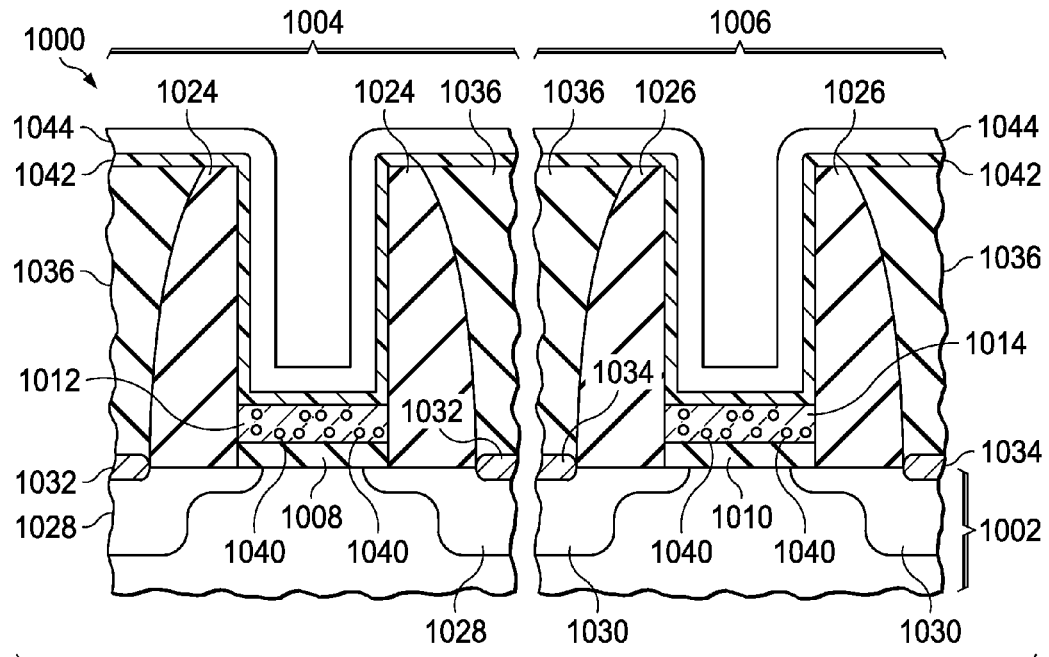

FIG. 1G depicts the integrated circuit (1000) after formation of an etch stop layer and an oxygen diffusion barrier layer. A thin etch stop layer (1042) is formed on an existing top surface of the integrated circuit (1000) including the top surfaces of the NMOS gate work function metal layer (1012) and the PMOS gate work function metal layer (1014). The etch stop layer (1042) is between 2 and 10 nanometers thick over the NMOS gate work function metal layer (1012) and the PMOS gate work function metal layer (1014), and is formed of a metallic material which allows oxygen to diffuse across the etch stop layer (1042) during a subsequent getter anneal process step, and provides an etch stop capability during a subsequent oxygen diffusion barrier etch process step, such as TaN, tungsten nitride (WN), titanium carbide (TiC), TaC, or tungsten carbide (WC). The etch stop layer (1042) may be formed by ALD, CVD, PVD, MOCVD or other suitable deposition method. An oxygen diffusion barrier layer (1044) is formed on a top surface of the etch stop layer (1042). The oxygen diffusion barrier layer (1044) is greater than 10 nanometers thick over the NMOS gate work function metal layer (1012) and the PMOS gate work function metal layer (1014), and is formed of a metallic material which blocks oxygen diffusion during the subsequent getter anneal process step, and has a high etch rate selectivity to the etch stop layer (1042) during the subsequent oxygen diffusion barrier etch process step, such as TiN. The oxygen diffusion barrier layer (1044) may be formed by ALD, CVD, PVD, MOCVD or other suitable deposition method.

Figure 1H:
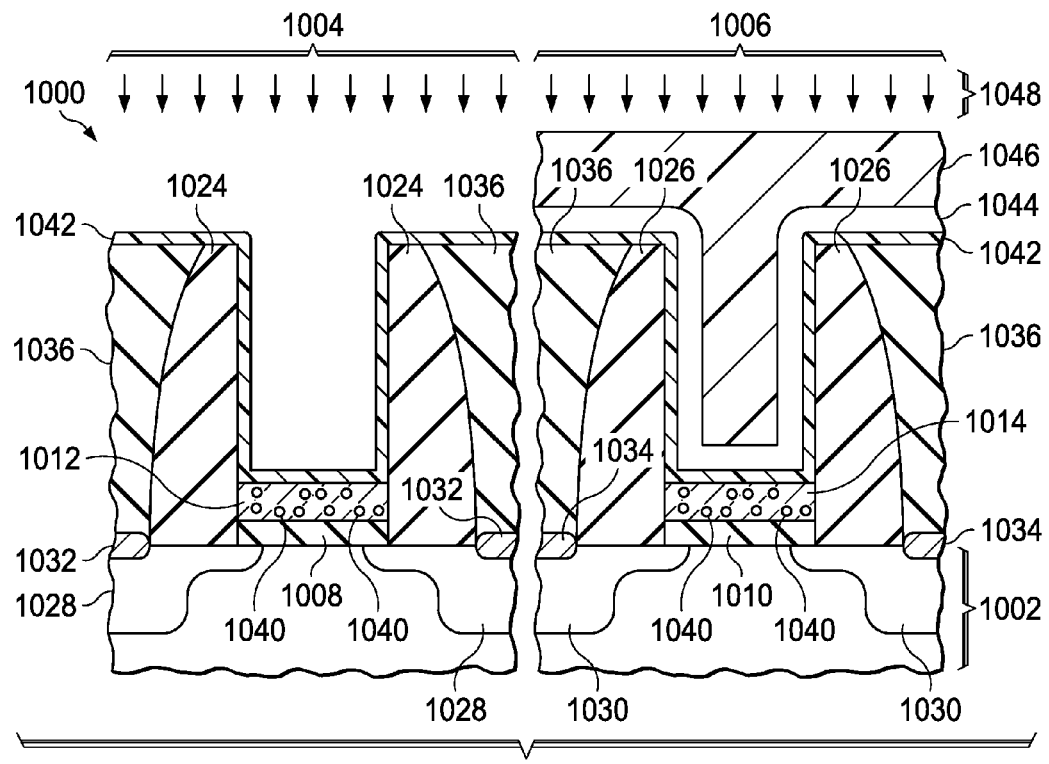

FIG. 1H depicts the integrated circuit (1000) during a process step to remove the oxygen diffusion barrier layer (1044) in the NMOS region (1004). An oxygen diffusion barrier photoresist pattern (1046) is formed on a top surface of the oxygen diffusion barrier layer (1044) in the PMOS region (1006). An oxygen diffusion barrier etch process (1048) is performed which removes substantially all the oxygen diffusion barrier layer (1044) in the NMOS region (1004) from the top surface of the etch stop layer (1042) in direct contact with the NMOS gate work function metal layer (1012). The oxygen diffusion barrier etch process (1048) may be an RIE process using chlorine etchants and possibly fluorine etchants. After the oxygen diffusion barrier etch process (1048) is completed, the oxygen diffusion barrier photoresist pattern (1046) is removed from the top surface of the oxygen diffusion barrier layer (1044), for example by exposing the integrated circuit (1000) to an oxygen containing plasma, followed by a wet cleanup to remove any organic residue from the top surface of the oxygen diffusion barrier layer (1044).

Figure 1I:
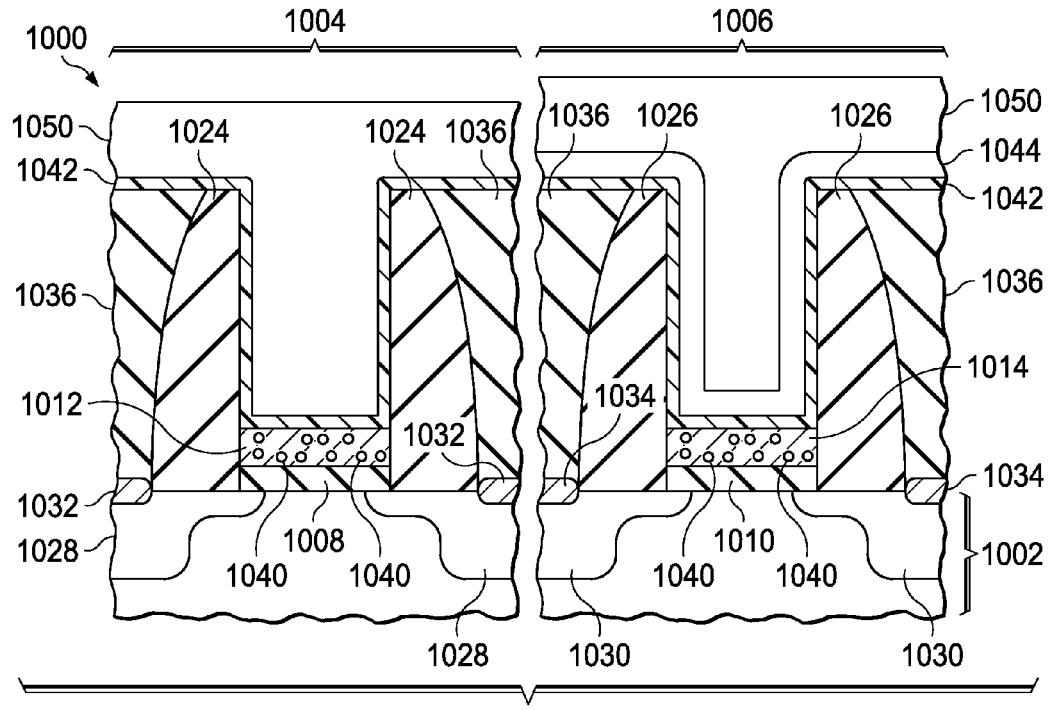

FIG. 1I depicts the integrated circuit (1000) after formation of a oxygen getter layer (1050) on the top surface of the etch stop layer (1042) over the NMOS gate work function metal layer (1012) and on the top surface of the oxygen diffusion barrier layer (1044) over the PMOS gate work function metal layer (1014). In one embodiment, the oxygen getter layer (1050) may be formed on an existing top surface of the integrated circuit (1000). The oxygen getter layer (1050) may include titanium, hafnium, zirconium, tantalum, aluminum, cerium, lanthanum, or other metal capable of gettering oxygen atoms from the NMOS gate work function metal layer (1012) during a subsequent getter anneal process step. The oxygen getter layer (1050) may be formed by ALD, CVD, PVD, MOCVD or other suitable deposition method.

Figure 1J:
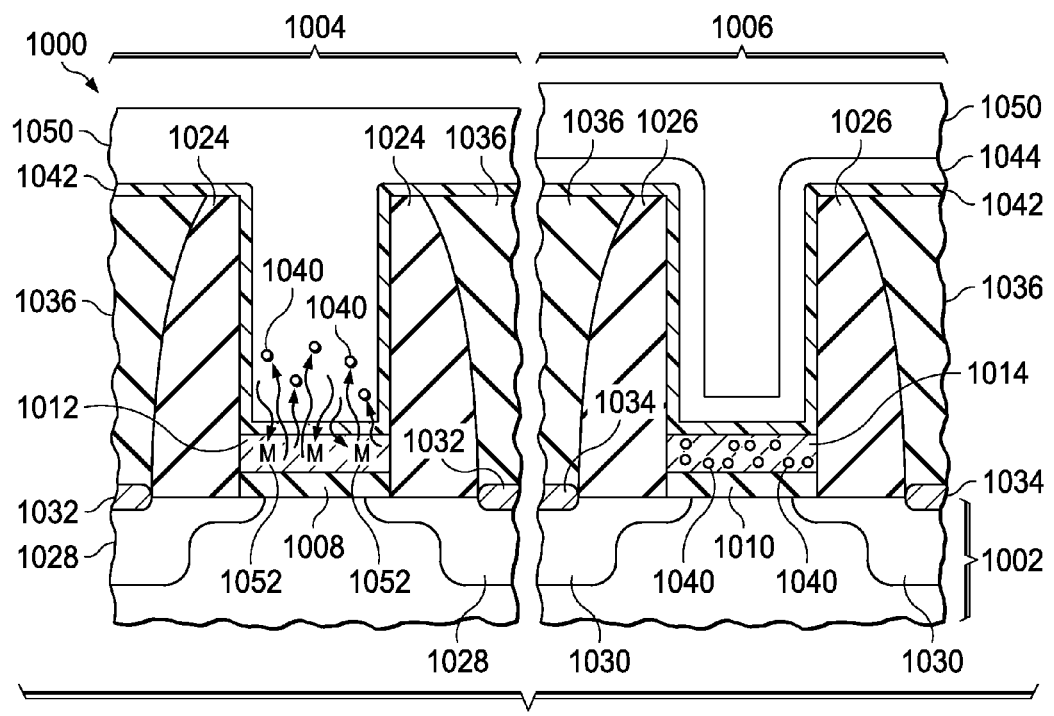

FIG. 1J depicts the integrated circuit (1000) during the getter anneal process step, in which the integrated circuit (1000) is heated to cause the oxygen atoms (1040) to diffuse from the NMOS gate work function metal layer (1012) through the etch stop layer (1042) into the oxygen getter layer (1050) in the NMOS region (1004). During the getter anneal process, metal atoms (1052) diffuse from the oxygen getter layer (1050) in the NMOS region (1004) through the etch stop layer (1042) into NMOS gate work function metal layer (1012). The effect of the getter anneal process is to reduce the effective work function of the NMOS gate work function metal layer (1012) to a value below 4.25 eV. After the getter anneal process is completed, the oxygen atoms (1040) in the NMOS gate work function metal layer (1012) have a distribution of less than $1 \times 10^{13}$ atoms/cm² within 1 nanometer of the top surface of the NMOS gate dielectric layer (1008). Metal atoms (1052) from the oxygen getter layer (1050) have a distribution of at least $1 \times 10^{13}$ atoms/cm² within 1 nanometer of the top surface of the NMOS gate dielectric layer (1008).

Oxygen gettering in the PMOS region (1006) is blocked by the oxygen diffusion barrier layer (1044). Less than 10 percent of the oxygen atoms (1040) in the PMOS gate work function metal layer (1014) are removed during the getter anneal process, so that the effective work function of the PMOS gate work function metal layer (1014) remains above 4.85 eV.

The getter anneal process is performed at less than 600° C. to avoid unwanted reactions in the silicide layers (1032, 1034). In one embodiment, the getter anneal process is performed in an inert ambient such as nitrogen or argon. In an alternate embodiment, the getter anneal process is performed at an ambient pressure below 1 millitorr.

Figure 1K:
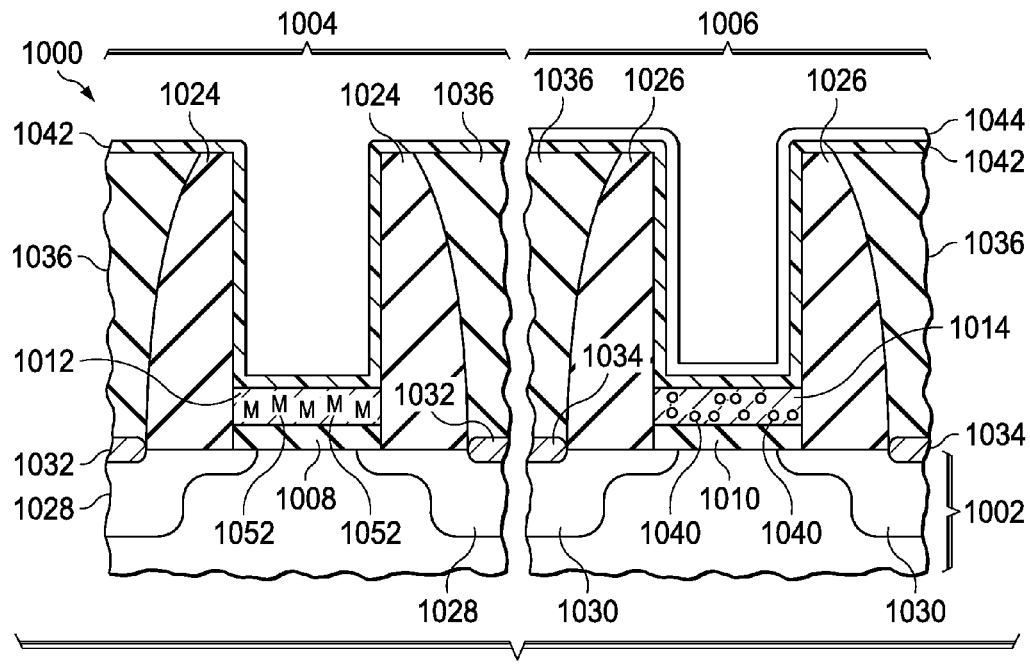

FIG. 1K depicts the integrated circuit (1000) after removing the oxygen getter layer. An oxygen getter etch process is performed, which may include immersion in an aqueous solution of a mixture of hydrogen peroxide and an alkaline etchant such as NH₄OH. All or part of the oxygen diffusion barrier layer (1044) may be removed from the PMOS region (1006). All or part of the etch stop layer (1042) in direct contact with the NMOS gate work function metal layer (1012) may be removed during the oxygen getter etch process. Similarly, all or part of the etch stop layer (1042) in direct contact with the PMOS gate work function metal layer (1014) may be removed during the oxygen getter etch process.

Figure 1L:
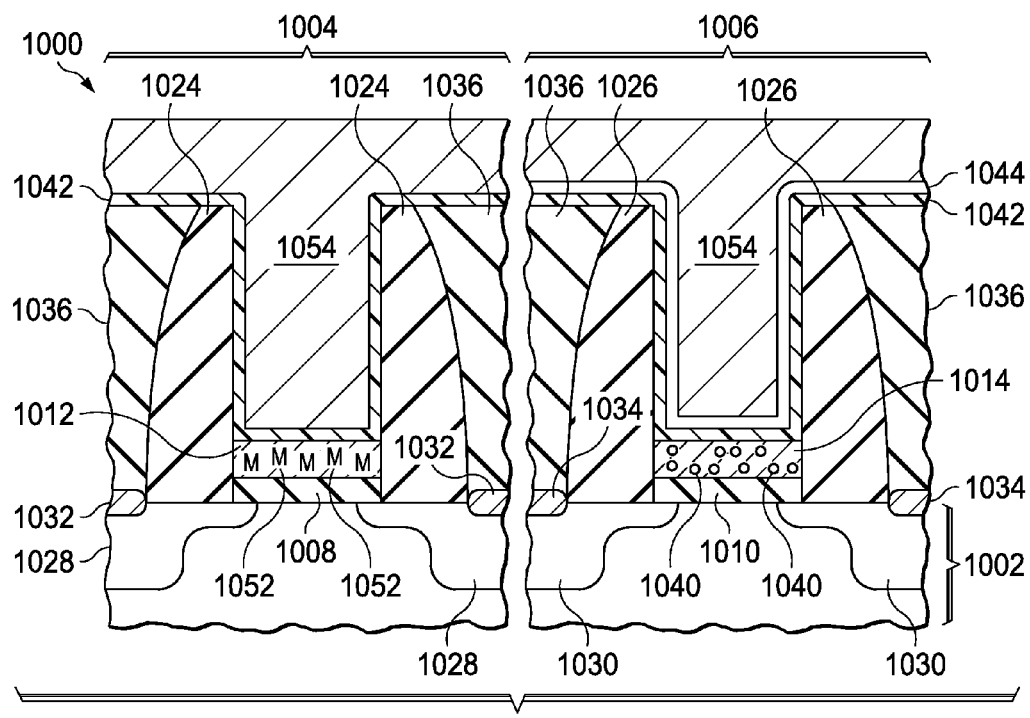

FIG. 1L depicts the integrated circuit (1000) after formation of a metal fill gate layer (1054) over the NMOS gate work function metal layer (1012) and the PMOS gate work function metal layer (1014). In one embodiment, the metal fill gate layer (1054) may be formed on an existing top surface of the integrated circuit (1000). The metal fill gate layer (1054) may be aluminum, tungsten, or any metal with a suitably low electrical resistivity. The metal fill gate layer (1054) may be formed by ALD, CVD, PVD, MOCVD or other suitable deposition method.

Figure 1M:
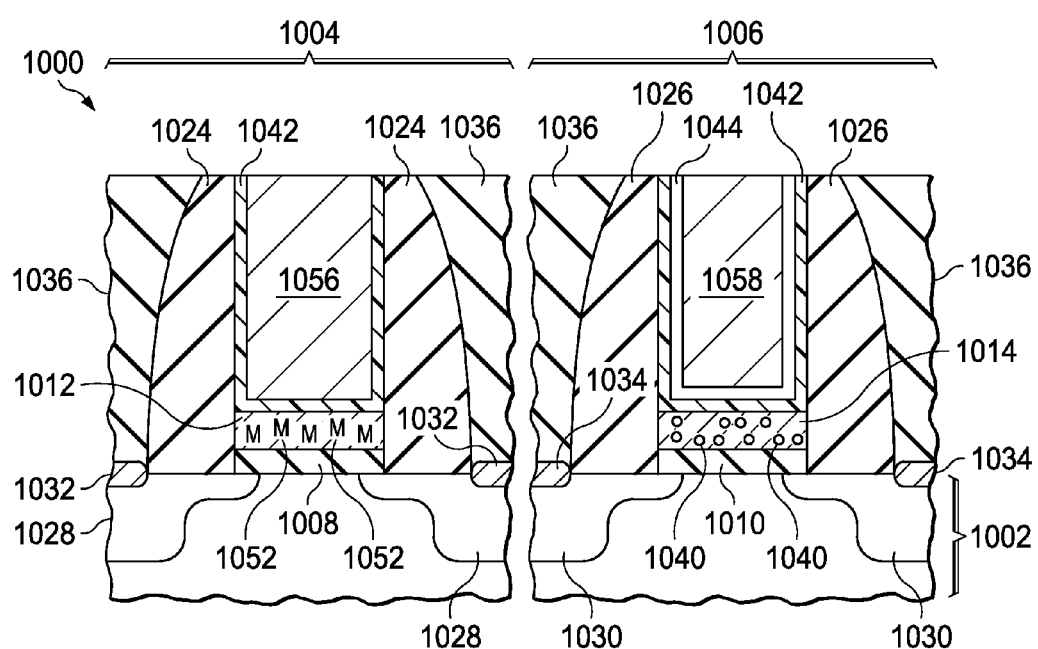

FIG. 1M depicts the integrated circuit (1000) after a planarizing process which removes the metal fill gate layer, the oxygen diffusion barrier layer (1044) if present, and the etch stop layer (1042) if present, from the top surface of the fill oxide layer (1036). Material from the metal fill gate layer is left over the NMOS gate work function metal layer (1012) to form an NMOS metal fill gate (1056) and is left over the PMOS gate work function metal layer (1014)) to form a PMOS metal fill gate (1058). The planarizing process may be

What is claimed is:

1. A process of forming an integrated circuit, comprising the steps of:
    forming a dummy PMOS gate stack and a dummy NMOS gate stack, wherein said dummy PMOS gate stack includes a PMOS gate dielectric layer, a PMOS gate work function metal layer and a PMOS dummy gate layer, and said dummy NMOS gate stack includes a NMOS gate dielectric layer, a NMOS gate work function metal layer and a NMOS dummy gate layer;
    removing said PMOS dummy gate layer and said NMOS dummy gate layer;
    performing a low temperature oxidation process on the NMOS gate work function metal layer and the PMOS gate work function metal layer;
    after performing the low temperature oxidation process, forming an oxygen diffusion barrier layer over said PMOS gate work function metal layer;
    forming an oxygen getter layer over said NMOS gate work function metal layer, wherein said oxygen getter layer is blocked from said PMOS gate work function metal layer by said oxygen diffusion barrier layer;
    performing a getter anneal process with the oxygen diffusion barrier layer over the PMOS gate work function metal layer and the oxygen getter layer over the NMOS gate work function metal layer; and
    forming an NMOS metal gate over said NMOS gate work function metal layer and a PMOS metal gate over said PMOS gate work function metal layer.

2. The process of claim 1, in which said step of forming an oxygen diffusion barrier layer further includes the step of forming an etch stop layer on said top surface of said NMOS gate work function metal layer prior to forming said oxygen diffusion barrier layer.

3. The process of claim 2, wherein:
    said etch stop layer is between 2 and 10 nanometers thick; and
    a composition of said etch stop layer is selected from the group consisting of: TaN, WN, TiC, TaC, and WC.

4. The process of claim 3, in which said step of forming an oxygen diffusion barrier layer further includes the step of forming said oxygen diffusion barrier layer on a top surface of said etch stop layer.

5. The process of claim 4, in which said step of forming an oxygen getter layer over said NMOS gate work function metal layer further includes the steps of:
    forming an oxygen diffusion barrier photoresist pattern on a top surface of said oxygen diffusion barrier layer, such that said oxygen diffusion barrier layer is exposed in said area for said NMOS gate;
    removing said oxygen diffusion barrier layer in said area for said NMOS gate; and
    forming said oxygen getter layer on said top surface of said etch stop layer in said area for said NMOS gate and on said top surface of oxygen diffusion barrier layer in said area for said PMOS gate.

6. The process of claim 5, in which said step of forming an NMOS metal gate and a PMOS metal gate further includes the steps of:
    removing said oxygen getter layer;
    forming a metal fill gate layer over said NMOS gate work function metal layer, over said PMOS gate work function metal layer and on a top surface of said fill oxide layer; and
    removing said metal fill gate layer from said top surface of said fill oxide layer.

7. The process of claim 1, wherein:
    a composition of said NMOS gate dielectric layer and a composition of said PMOS gate dielectric layer are each selected from the group consisting of: $SiO_x$, $Si_3N_4$, SiON, $Al_2O_3$, AlON, HfO, HfSiO, HfSiON, ZrO, ZrSiO, ZrSiON, nitridated $SiO_x$, nitridated $Al_2O_3$, nitridated HfO, nitridated HfSiO, nitridated ZrO, nitridated ZrSiO, and any combination thereof.

8. The process of claim 1, wherein:
    said NMOS gate work function metal layer is between 1 and 10 nanometers thick;
    said PMOS gate work function metal layer is between 1 and 10 nanometers thick; and
    said NMOS gate work function metal layer and said PMOS gate work function metal layer each include a metal selected from the group consisting of: TiN, TaN, and TaC.

9. The process of claim 1, wherein said step of performing a low temperature oxidation process further includes the step of exposing said NMOS gate work function metal layer and said PMOS gate work function metal layer to a steam ambient between 300° C. and 600° C. for 10 seconds to 30 minutes.

10. The process of claim 1, wherein said step of performing a low temperature oxidation process further includes the step of exposing said NMOS gate work function metal layer and said PMOS gate work function metal layer to a plasma containing oxygen and hydrogen at a temperature up to 500° C.

11. The process of claim 1, wherein said step of performing a low temperature oxidation process further includes the step of anodizing said NMOS gate work function metal layer and said PMOS gate work function metal layer.

12. The process of claim 1, wherein said step of performing a low temperature oxidation process further includes the step of exposing said NMOS gate work function metal layer and said PMOS gate work function metal layer to dry ambient containing an oxidizing component at a temperature between 300° C. and 700° C.

13. The process of claim 12, wherein said oxidizing component is selected from the group consisting of: $O_2$, $O_3$, NO, $NO_2$, and any combination thereof.

14. The process of claim 1, wherein said step of performing a low temperature oxidation process further includes the step of exposing said gate work function metal layer to $H_2O$ containing dissolved ozone.

15. The process of claim 1, wherein said oxygen diffusion barrier layer is more than 10 nanometers thick.

16. The process of claim 1, wherein a composition of said oxygen getter layer is selected from the group consisting of: titanium, hafnium, zirconium, tantalum, aluminum, cerium, and lanthanum.

17. The process of claim 1, wherein said PMOS gate work function metal layer includes oxygen atoms such that said oxygen atoms have a distribution of at least $1 \times 10^{15}$ atoms/$cm^2$ within 1 nanometer of said top surface of said gate dielectric layer.

18. The process of claim 1, wherein said PMOS gate work function metal layer includes oxygen atoms such that said oxygen atoms have an average concentration between $1 \times 10^{18}$ atoms/$cm^3$ and $1 \times 10^{21}$ atoms/$cm^3$.

19. The process of claim 1, wherein:

said NMOS gate work function metal layer includes oxygen atoms such that said oxygen atoms have a distribution less than $1\times10^{13}$ oxygen atoms/cm$^2$ within 1 nanometer of said top surface of said NMOS gate dielectric layer; and said NMOS gate work function metal layer includes metal atoms from said oxygen getter layer such that said metal atoms have a distribution of at least $1\times10^{13}$ atoms/cm$^2$ within 1 nanometer of said top surface of said NMOS gate dielectric layer.

* * * * *